United States Patent
Wang et al.

(10) Patent No.: US 6,844,121 B2
(45) Date of Patent: Jan. 18, 2005

(54) METHOD OF MANUFACTURING COLOR FILTER

(75) Inventors: Eric Wang, Hsinchu (TW); Robin Shyu, Taichung (TW); Jim Chung, Hsinchu (TW); Michael Kuo, Hsinchu (TW)

(73) Assignee: Premier Image Technology, Taipei (TW)

( * ) Notice: Subject to any disclaimer, the term of this patent is extended or adjusted under 35 U.S.C. 154(b) by 33 days.

(21) Appl. No.: 10/329,576

(22) Filed: Dec. 27, 2002

(65) Prior Publication Data

US 2004/0126676 A1 Jul. 1, 2004

(51) Int. Cl.[7] ................................................. G03F 9/00
(52) U.S. Cl. ........................... 430/7; 430/321; 430/323; 430/324; 430/329; 430/330; 349/106
(58) Field of Search ........................... 430/7, 321, 323, 430/324, 329, 330; 349/106

(56) References Cited

U.S. PATENT DOCUMENTS

| | | | | |
|---|---|---|---|---|
| 5,120,622 A | * | 6/1992 | Hanrahan | 430/7 |
| 5,462,885 A | * | 10/1995 | Nasu et al. | 438/30 |
| 5,711,889 A | * | 1/1998 | Buchsbaum | 216/5 |

* cited by examiner

*Primary Examiner*—John S. Chu
(74) *Attorney, Agent, or Firm*—Browdy and Neimark, P.L.L.C.

(57) ABSTRACT

A method of manufacturing color filter comprising the steps of forming a metal layer and a photoresistor layer on a substrate; defining a dent over the photoresistor layer and removing the metal layer below the dent; depositing an optical filter material over the resulting structure at relative high temperature, lift off the photoresistor layer by etching the metal layer. The optical filter material can be fabricated at higher temperature (300–400° C.) than conventional cold process, the extinction ratio of the filter made by the optical filter material can be as high as 90% to enhance the performance of the projector system.

11 Claims, 2 Drawing Sheets

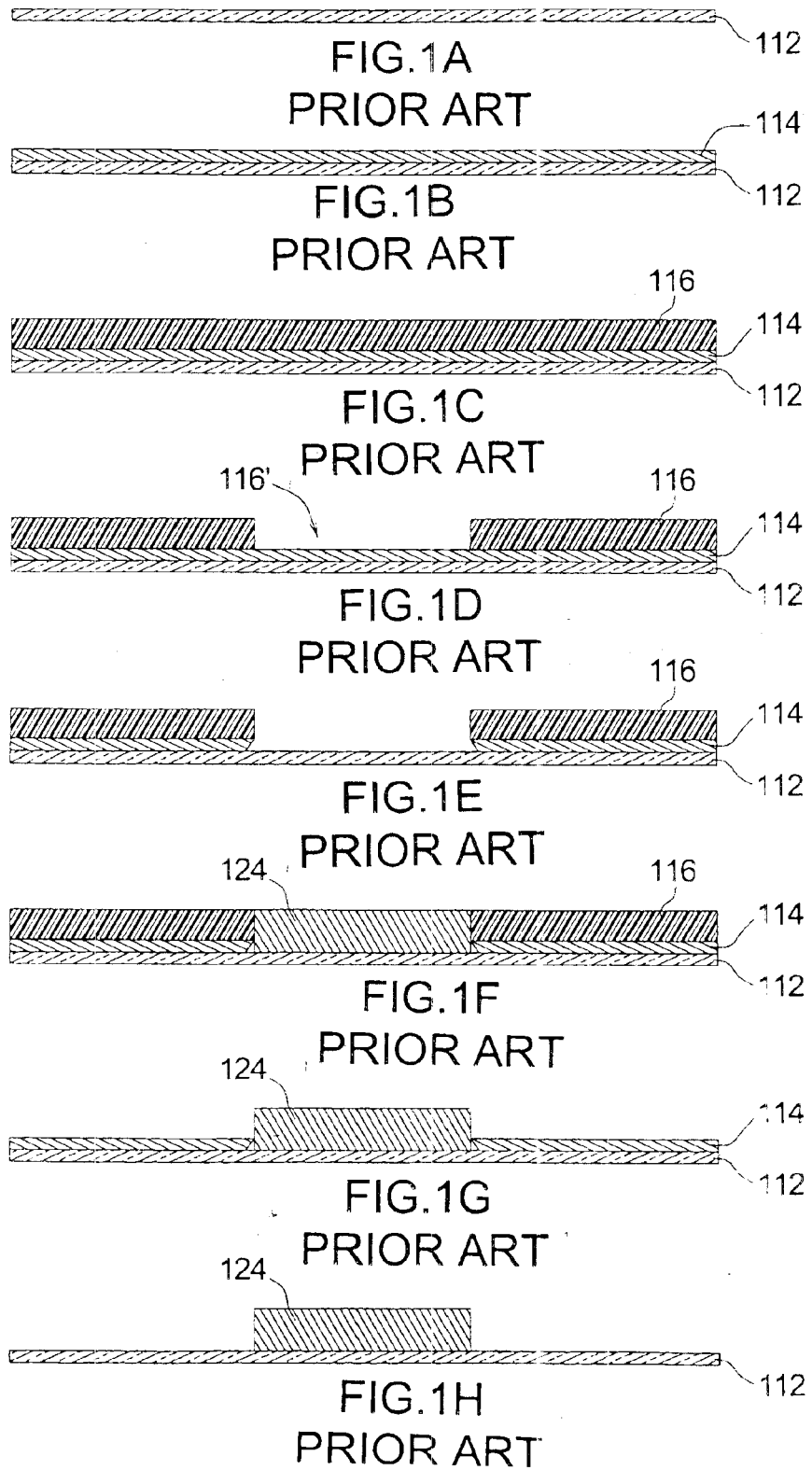

METHOD OF MANUFACTURING COLOR FILTER

FIELD OF THE INVENTION

The present invention relates to a method of manufacturing color filter, especially to a method of manufacturing color filter with high quality by depositing the color filter material at higher temperature.

BACKGROUND OF THE INVENTION

Color filters are widely used in projector system or virtual reality system to provide RGB primary colors from a white light source. The conventional projector system generally uses separately assembled color filters. More particularly, the color filters are separately manufactured and then assembled to the projector system. The manufacture tolerance is not important issue for the color filters.

To provide more compact color filters, method involving microelectronic and microlithography process are proposed to manufacture color filter films on transparent substrate.

FIG. 1 shows a prior art process for color filter film (U.S. Pat. No. 5,711,889):

S100: preparing a substrate 112, as shown in FIG. 1A;

S102: forming a releasing layer 114 by evaporation atop the substrate 112, as shown in FIG. 1B;

S104: applying a photoresistor layer 116 atop the releasing layer 114 by conventional spin technology and then backing the photoresistor layer 116, as shown in FIG. 1C;

S106: exposing a predetermined portion of the photoresistor layer 116 by photolithography to define a dent 116' on the photoresistor layer 116, where the optical filter will be positioned, as shown in FIG. 1D;

S108: etching a portion of the releasing layer 114 below the dent 116', as shown in FIG. 1E;

S110: depositing an optical filter material 124 into the dent 116' by electron gun evaporation, as shown in FIG. 1F;

S112: removing the remaining photoresistor layer 116 by suitable photoresistor remover such as acetone to expose underlying releasing layer 114, as shown in FIG. 1G;

S114: etching underlying releasing layer 114 to form optical filter material 124 with predetermined pattern, as shown in FIG. 1G.

The optical filter material 124 with predetermined pattern can form Archimedes pattern on the substrate 112 and used with a light pipe to provide light filtering effect for a projector system.

However, in above-mentioned process, the step of depositing an optical filter material 124 in step S110 is a "cold process" because the photoresistor layer 116 cannot resist high-temperature process. In conventional deposition by electronic gun, the substrate is heated to a relatively high temperature to enhance the quality of deposited film. Due to poor thermo stability of the photoresistor layer 116, optical filter material 124 with high quality is hard to form and extinct ratio of the optical filter using the optical filter material 124 is also poor.

SUMMARY OF THE INVENTION

It is the object of the present invention to provide a method of manufacturing color filter with high quality by depositing the color filter material at higher temperature.

To achieve the above object, the present invention provides a method of manufacturing color filter comprising the steps of: forming a metal layer and a photoresistor layer on a substrate; defining a dent over the photoresistor layer and removing the metal layer below the dent; depositing an optical filter material over the resulting structure at relative high temperature, lift off the photoresistor layer by etching the metal layer. The optical filter material can be fabricated at higher temperature (300–400° C.) than conventional cold process, the extinction ratio of the filter made by the optical filter material can be as high as 90% to enhance the performance of the projector system.

The various objects and advantages of the present invention will be more readily understood from the following detailed description when read in conjunction with the appended drawing, in which:

BRIEF DESCRIPTION OF DRAWINGS

FIG. 1 shows a prior art process for color filter film; and

DETAILED DESCRIPTION OF THE INVENTION

Figure 2A:
FIG. 2 shows the process for manufacturing color filter according to the present invention.
Figure 2B:
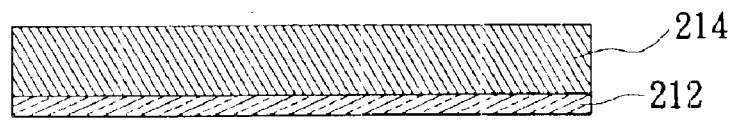
Figure 2C:
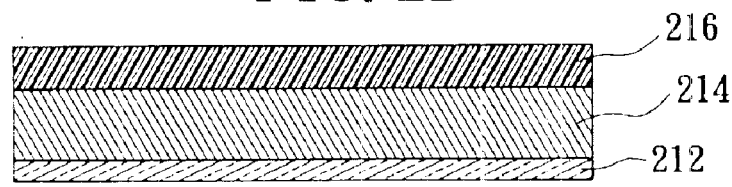
Figure 2D:
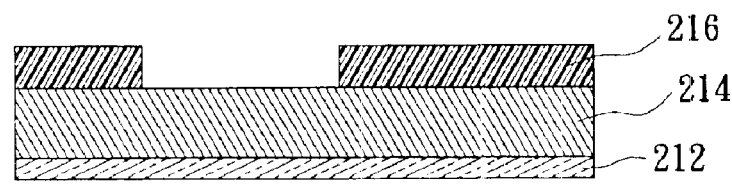
Figure 2E:
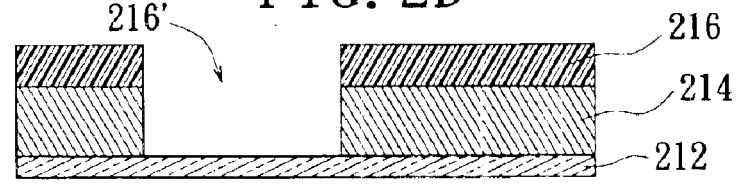
Figure 2F:
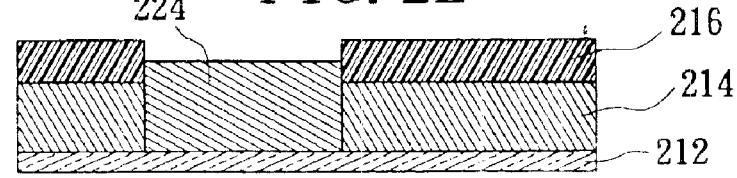
Figure 2G:
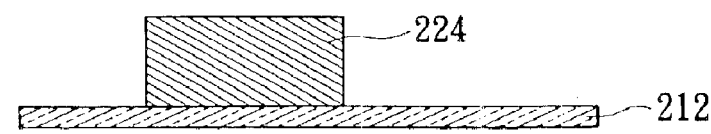

FIG. 2 shows the process for manufacturing color filter according to the present invention, which comprise following steps:

S200: preparing a substrate 212, as shown in FIG. 2A;

S202: forming a metal layer 214 by evaporation atop the substrate 212, as shown in FIG. 2B;

S204: applying a photoresistor layer 216 atop the metal layer 214 by conventional spin technology, as shown in FIG. 2C;

S206: soft-baking the photoresistor layer 216;

S208: exposing a predetermined portion of the photoresistor layer 216 by photolithography;

S210: hard baking the exposed photoresistor layer 216;

S212: developing the exposed photoresistor layer 216 to remove part of the photoresistor layer 216 for defining a dent 216' on the photoresistor layer 216, as shown in FIG. 2D;

S214: low-temperature baking the remained photoresistor layer 216 by temperature from room temperature to 100° C.;

S216: etching the portion of the metal layer 214 below the dent 216' with HCl, as shown in FIG. 2E;

S218: the resulting structure is brought to a coater for high-temperature deposition process for temperature 300–400° C. and time 4–6 hours, thus forming an optical filter material 224, as shown in FIG. 2F, it should be noted part of the optical filter material 224 is laid on the photoresistor layer 216;

S220: etching the resulting structure by $HNO_3$/HCl and lifting-off the metal layer 214 and photoresistor layer 216 atop the metal layer 214 to form optical filter material 224 with predetermined pattern, as shown in FIG. 2G.

In the step S202, the material choice of the metal layer 214 can be selected from the group consisting of Al, Cd, Cr and Au. The metal layer 214 is used as protective layer of the substrate 212 and the photoresistor layer 216 is used as protective/sacrifice layer for the metal layer 214.

In the step S202, the etching rate of the $HNO_3$/HCl etching solution is extremely fast such that pattern of optical filter material 224 with vertical edge can be easily formed. Moreover, the HNO$_3$/HCl etching solution is used to etch the metal layer 214 below the photoresistor layer 216, the photoresistor layer 216 can be subjected to a relatively long-time, high-temperature (300–400° C. for 4–6 hours) deposition process. Even thought the photoresistor layer 216 is broiled in the long-time and high-temperature deposition process, it is beneficial for the HNO$_3$/HCl etching solution to penetrate through the photoresistor layer 216 and successfully etch the metal layer 214, thus lifting off the photoresistor layer 216.

In the step S216, the photoresistor layer 216 is not subjected to the long-time and high-temperature deposition process and can be used as protective layer for underlying metal layer 214. Moreover, to provide satisfactory lift off effect, the thickness of the metal layer 21 should be at least twice of the photoresistor layer 216.

To sum up, in the method of manufacturing color filter according to the present invention, the optical filter material can be fabricated at higher temperature (300–400° C.) than conventional cold process, the extinction ratio of the filter made by the optical filter material can be as high as 90% to enhance the performance of the projector system.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claim is:

1. A method of manufacturing a color filter, comprising the steps of
   (a) preparing a substrate;
   (b) forming a metal layer by evaporation atop the substrate;
   (c) applying a photoresistor layer atop the metal layer and defining a dent with predetermined pattern on the photoresistor by a photolithography process;
   (d) removing a portion of the metal layer below the dent;
   (e) depositing an optical filter material over the resulting structure;
   (f) using an etching solution to etch the metal layer and lift off the remaining photoresistor layer;
   wherein the thickness of the metal layer is at least twice that of the photoresistor layer.

2. A method of manufacturing a color filter, comprising the steps of
   (a) preparing a substrate;
   (b) forming a metal layer by evaporation atop the substrate;
   (c) applying a photoresistor layer atop the metal layer and defining a dent with predetermined pattern on the photoresistor by a photolithography process;
   (d) removing a portion of the metal layer below the dent;
   (e) depositing an optical filter material over the resulting structure;
   (f) using an etching solution to etch the metal layer and lift off the remaining photoresistor layer;
   wherein the step (e) of depositing an optical filter material is performed at 300–400° C. for 4–6 hour.

3. The method of manufacturing the color filter of claim 2, wherein the material for the metal layer is selected from the group consisting of Al, Cd, Cr and Au.

4. The method of manufacturing the color filter of claim 2, wherein the step (c) comprises the following sub-steps:
   (c1) applying the photoresistor layer and then soft-baking the photoresistor layer;
   (c2) exposing a predetermined portion of the photoresistor layer by photolithography;
   (c3) hard baking the exposed photoresistor layer; and
   (c4) developing the exposed photoresistor layer to remove part of the photoresistor layer for defining the dent on the photoresistor layer.

5. The method of manufacturing the color filter of claim 4, further comprising the sub-step of
   (c5) low-temperature baking of a remaining portion of said photoresistor layer at a temperature from room temperature to 100° C.

6. The method of manufacturing the color filter of claim 2, wherein the etching solution in step (f) is HNO$_3$/HCl.

7. The method of manufacturing the color filter of claim 2, wherein the thickness of the metal layer is at least twice that of the photoresistor layer.

8. The method of manufacturing the color filter of claim 1, wherein the material for the metal layer is selected from the group consisting of Al, Cd, Cr and Au.

9. The method of manufacturing the color filter of claim 1, wherein the step (c) comprises the following sub-steps:
   (c1) applying the photoresistor layer and then soft-baking the photoresistor layer;
   (c2) exposing a predetermined portion of the photoresistor layer by photolithography;
   (c3) hard baking the exposed photoresistor layer; and
   (c4) developing the exposed photoresistor layer to remove part of the photoresistor layer for defining a dent on the photoresistor layer.

10. The method of manufacturing the color filter of claim 9, further comprising the sub-step of
    (c5) low-temperature baking of a remaining portion of said photoresistor layer at a temperature from room temperature to 100° C.

11. The method of manufacturing the color filter of claim 1, wherein the etching solution in step (f) is HNO$_3$/HCl.

* * * * *